United States Patent [19]
Gold

[11] Patent Number: 5,592,033
[45] Date of Patent: Jan. 7, 1997

[54] PHOTOCELL SWITCHING CIRCUIT

[75] Inventor: John H. Gold, Binghamton, N.Y.

[73] Assignee: Cooper Industries, Inc., Houston, Tex.

[21] Appl. No.: 167,065

[22] Filed: Dec. 16, 1993

[51] Int. Cl.⁶ .......................... G02B 27/00; H01H 35/00
[52] U.S. Cl. .......................... 307/117; 250/551; 307/125; 315/159
[58] Field of Search ........................... 250/551; 307/117, 307/141, 141.4, 141.8, 112, 113, 116, 125; 315/157, 158, 159; 327/438, 439, 447, 465

[56] References Cited

U.S. PATENT DOCUMENTS

| | | | |
|---|---|---|---|
| 3,932,770 | 1/1976 | Fantozzi | 307/252 |
| 4,091,276 | 5/1978 | Lebovici | 250/214 |
| 4,481,423 | 11/1984 | Conway | 250/551 |
| 4,651,023 | 3/1987 | Parsonage | 307/117 |
| 4,658,129 | 4/1987 | Fan | 250/214 |
| 4,709,154 | 11/1987 | Rademaker et al. | 250/551 |
| 4,745,311 | 5/1988 | Iwasaki | 307/632 |
| 4,758,767 | 7/1988 | Blake | 315/158 |
| 4,800,293 | 1/1989 | Miller | 307/117 |
| 4,864,126 | 9/1989 | Walters et al. | 250/551 |
| 5,057,700 | 10/1991 | Choi | 307/117 |
| 5,087,808 | 2/1992 | Reed | 250/214 |
| 5,105,090 | 4/1992 | Miyajima et al. | 250/551 |
| 5,170,059 | 12/1992 | Palaniappan | 250/551 |
| 5,257,639 | 11/1993 | Prescott et al. | 137/82 |

OTHER PUBLICATIONS

Crouse–Hinds Code Digest 1993, Cooper Industries, 1993.
DMV Champ Series Lighting Fixtures, Cooper Industries, 1992, 6 pages.
VMW Champ Series Lighting Fixtures, Cooper Industries, 1992, 6 pages.
Combating Corrosion—How To Select The Most Resistant Materials And Finishes For Use In Corrosive Atmospheres And Environments, Cooper Industries, 1987, 7 pages.
Champ, H.I.D. Lighting Fixtures Application Guide, Cooper Industries, 1991.

*Primary Examiner*—William M. Shoop, Jr.
*Assistant Examiner*—Jonathan S. Kaplan

[57] ABSTRACT

The present invention generally relates to a cost-effective photocell switching circuit which can be manufactured as a single, factory sealed unit suitable for use in Class I, Division 2 environments. In accordance with the present invention, the switching circuit can be wholly formed with electrical components (i.e., without movable parts such as electro-mechanical relays). Further, features of switching circuits designed in accordance with the present invention render the electrical components immune to noise such that the components can be combined in a single unit, explosion-proof housing, thus reducing overall switching circuit complexity and production costs.

28 Claims, 3 Drawing Sheets

PHOTOCELL SWITCHING CIRCUIT

BACKGROUND OF THE INVENTION

1. Field of the Invention

The present invention relates generally to switching circuits, and more particularly, to photocell switching circuits suitable for use in hazardous environments.

2. State of the Art

It is often necessary to install electrical equipment in hazardous areas such as areas which contain explosive gases or dusts. In hazardous areas, such as explosive environments, any source of energy can touch off an explosion when flammable gases or combustible dusts are mixed in proper proportion with air. Equipment such as electrical switching circuits (e.g., relays) can produce arcs or sparks in normal operation (i.e., when contacts are opened and closed) that can easily cause ignition of flammable gases or combustible dusts. Further, any device which produces heat can produce surface temperatures which may exceed safe limits of a flammable atmosphere and result in ignition.

Because electrical safety is of critical importance, electrical installations must be designed to prevent accidental ignition of flammable liquids, vapors or dusts released to the atmosphere. The National Fire Protection Association, Inc. (NFPA) 70-1993, National Electrical Code, Copyright 1992, NFPA, Quincy Massachusetts 02269 sets forth definitions to clarify what constitutes hazardous areas and constraints imposed on such areas to ensure safe operation of electrical equipment therein.

Article 500 entitled "Hazardous (Classified) Locations" of the 1993 National Electric Code covers requirements for electrical equipment in locations where fire or explosion hazards may exist due to flammable gases or vapors, flammable liquids, combustible dust, or ignitable fibers or flyings. Class I atmospheric hazards are divided into two divisions. Division 1 covers locations where flammable gases or vapors may exist under normal operating conditions, under frequent repair or maintenance operations, or where breakdown or faulty operation of process equipment might also cause simultaneous failure of electrical equipment. Division 2 covers locations where flammable gases, vapors or volatile liquids are handled either in a closed system, or confined within suitable enclosures, or where hazardous concentrations are normally prevented by positive mechanical ventilation. Areas adjacent to Division 1 locations are also considered Division 2 areas.

In Class I, Division 1 and 2 locations, conventional electrical equipment such as switching circuits (e.g., relays, contacters and switches) having arcing contacts must be enclosed in explosion-proof housings or enclosures. The enclosures must prevent ignition of an explosive gas or vapor which may surround the enclosure such that sparks inside the enclosure are prevented from igniting a larger explosion outside the enclosure. Such an explosion-proof enclosure must be formed of adequate strength to withstand, for example, a hydrostatic pressure test of four times the maximum pressure from an explosion within the enclosure. Further, such an enclosure-must be fabricated as a "flame-tight" housing, thus requiring that joints or flanges be maintained within narrow tolerances.

The requirement for enclosures suitable for use in Class I, Division 1 and 2 locations can impose significant design constraints and production costs on electrical equipment to be used in these locations. For example, electrical circuits are used to control lighting fixtures which are to be used in Class I, Division 1 and 2 locations. In locations where explosive gases or vapors exist, bare lamps or non-explosion proof enclosed equipment constitute hazards since bare lamps or exposed electrical equipment can cause an explosion. A typical switching circuit used to control the ON/OFF operation of such lighting fixtures includes a photocell which responds to ambient light so that the lamp is turned ON only when insufficient ambient light exists in the hazardous location. Because of their insensitivity to noise, photocells have been used in applications such as Class I, Division 2 environments wherein explosion-proof enclosures are typically required.

Conventional photocell switching circuits used in hazardous locations include general use photocells in conjunction with an electro-mechanical relay to provide a switching function. However, the potential for arcing and sparks generated by an electro-mechanical relay requires that the electro-mechanical relay be housed in an approved enclosure separate from or integrated with the photocell. The need for an electro-mechanical relay housed in an explosion-proof enclosure results in added switching circuit complexity. Further, the explosion-proof enclosure needed to house the electro-mechanical relay requires external seals, and is costly to manufacture.

U.S. Pat. No. 4,658,129 (Fan) discloses a general purpose photoelectric control device which includes a trigger unit 2. The trigger unit 2 includes a silicon controlled rectifier (SCR) 21 having a gate G2 connected to a photoelectric sensing element 13 of a sensing unit 1 via a capacitor 22. A first switching unit 3 supplies a rectified voltage to the sensing unit 1. A second switching unit 4 includes a TRIAC 41 which turns a load unit 5 on and off in response to light intensity changes detected by the sensing unit 1.

The general purpose photoelectric control device of U.S. Pat. No. 4,658,129 is unsuitable for use in hazardous locations. For example, the switching devices of this patent (e.g., SCR 21 and TRIAC 41) are temperature dependent devices (i.e., their switching threshold fluctuates with changes in temperature). The control device of this patent is analog in nature (i.e., the SCR 21 is gated with an analog signal) and is only calibrated, if at all, for use with a specific temperature (i.e., no temperature compensation is provided). Further, the disclosed control device is only useable with a limited input voltage range (i.e., no voltage regulation is provided).

Accordingly, it would be desirable to eliminate any need for using remote photocells to control relays housed in separate explosion-proof housings for Class I, Division 1 and 2 environments by providing a less complex, more cost-effective switching circuit suitable for high temperature operation in hazardous environments. For example, such a switching circuit should be useable in high intensity discharge (HID) lighting wherein electrical components of the switching circuit must be suitable for operation at 90° C. ambient without degradation of performance. Further, it would be desirable to provide a switching circuit which operates independently of temperature variations and which is useable with a wide range of voltage inputs.

SUMMARY OF THE INVENTION

The present invention generally relates to a cost-effective photocell switching circuit which can be manufactured as a single, factory sealed unit suitable for use in Class I, Division 1 and 2 environments. In accordance with the present invention, the switching circuit is wholly formed with electrical components (i.e., no movable parts, such as electro-mechanical relays).

Exemplary embodiments of the present invention generally relate to a switching circuit comprising means for detecting light to produce a light detection signal, means for producing a control signal in response to said light detection signal, means responsive to said control signal for gating energy from said power supply providing means to a load, and means for enclosing said energy gating means and said light detection means in a single unit explosion-proof enclosure. Further, exemplary embodiments of the switching circuit can be encapsulated in a relatively small enclosure means using a potting material (e.g., epoxy) to provide a single unit, potted photocell switching circuit.

Features of switching circuits designed in accordance with the present invention render the electrical components immune to noise such that the components can be combined in a single unit, explosion-proof housing, thus reducing overall switching circuit complexity and production costs. Exemplary switching circuits in accordance with the present invention, operate independently of temperature fluctuations, and avoid a need to compensate any such temperature fluctuations. Exemplary embodiments are operable over temperature fluctuations of plus or minus 60° C. or greater, and/or over a range of −40° C. to +90° C., or greater. Input voltage is regulated to render exemplary embodiments operable with a wide range of input voltages (e.g., useable over input voltage range of plus or minus 25 percent). In addition, hysteresis is used to provide separate on and off thresholds which inhibit exemplary embodiments from entering an undesirable oscillatory mode without requiring shielding of the light detection means.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

Figure 1:
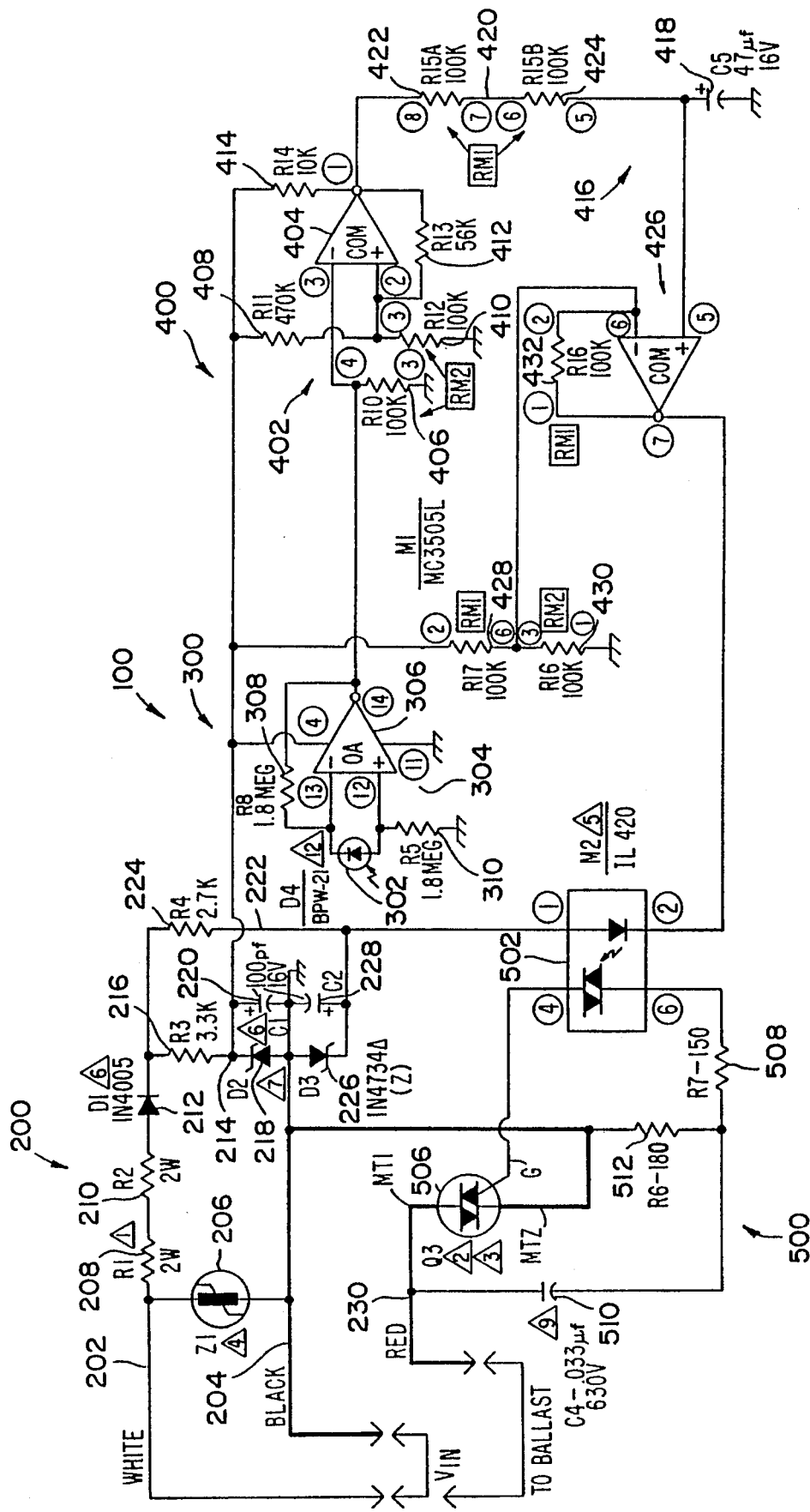
FIG. 1 shows an exemplary circuit diagram of a photocell switching circuit in accordance with the present invention.

Referring to FIG. 1, an exemplary embodiment of a switching circuit designed in accordance with the present invention is illustrated. The FIG. 1 circuit is generally designated 100, and includes means for supplying power 200. The power supply means 200 receives a power input via input lines 202 and 204. The power supply input lines apply a line voltage across a metal oxide varistor (MOV) designated Z1 and represented as element 206. The metal oxide varistor clamps spikes appearing in the line voltage and thereby provides transient voltage protection to the FIG. 1 circuit, thus enhancing circuit reliability and noise immunity.

Current supplied by the line voltage is input to a current limiter represented by two serially connected resistors 208 and 210. Those skilled in the art will recognize that the resistors can be combined into a single resistor. However, for purposes of the exemplary embodiment illustrated, two separate resistors are provided to improve heat transfer. The resistance of the serially connected resistors 208 and 210, and characteristics of the metal oxide varistor 206, can be varied as a function of the input voltage range. For example, values for the nominal line voltage input to the leads 202 and 204, attendant resistance values for each of the resistors 208 and 210, and exemplary model numbers (e.g., available from Harris, Corp.) 25 for the metal oxide varistor 206 are illustrated in the following Table I:

TABLE I

| | | VOLTAGE | | |
|---|---|---|---|---|
| | NOM V | R1 & R2 (ohms) | MOV | Q3 |
| 1 | 120 | 1800 | V130LA1 | 2N6343A |
| 2 | 220 | 4300 | V250LA2 | 2N6344A |
| 3 | 277 | 5600 | V300LA2 | 2N6345A |

The power supply means 200 also includes a half-wave rectifier represented as a diode 212. In an exemplary embodiment, the diode D1 can be a Siemens Corp. Model Number 1N4005. In accordance with a significant feature of the present invention, the power input via the input lines 202 and 204 is separated into two individual power supply portions to maximize efficiency of the FIG. 1 circuit. An exemplary power supply means permits operation of the FIG. 1 circuit over a relatively wide input voltage range (e.g., plus or minus 25 percent, or greater) due to provision of voltage regulation.

More particularly, the power supply means 200 includes a first power supply portion designated 214 which includes resistors 216, a Zener diode 218 and a capacitor 220. In an exemplary embodiment, the capacitor can be a 16 volt, 100 microfarad capacitor and the resistor 216 can be a 3.3 kilo-ohm resistor. A second power supply portion is labeled 222 and includes a resistor 224, a Zener diode 226 and a capacitor 228. In an exemplary embodiment, the resistor 224 can be a 2.7 kilo-ohm resistor and the capacitor 228 can be of similar capacitance to that of the capacitor 220. The dual Zener diodes 218 and 226 are clamped to a 5.2 volt DC power supply.

By splitting the power supply means into first and second portions, a stiff reference voltage can be provided to the analog circuitry of the FIG. 1 circuit by decoupling it from the higher current requirements of a high power output switch driver (i.e., the driver represented by an opto-coupler module 502, labeled M2 in FIG. 1). The first power supply portion which includes the Zener diode 218 provides continuous power to all of the analog components included in a light detection means 300 and a control signal producing means 400. On the contrary, the second power supply portion which includes the Zener diode 226 provides power to an energy gating means generally represented as element 500. Since the energy gating means 500 is only gated ON when the light received by a photodiode 302 of the light detection signal producing means 300 is below a threshold, the use of a separate power supply portion for the energy gating means can reduce overall power requirements by, for example, 30% or greater.

In the exemplary configuration of a power supply means illustrated in the FIG. 1 circuit, a power input occurs across the input lines 202 and 204, with line 204 being common to the input and the output. A load driven by the power supply is connected across the input lead 202 and an output lead 230, with the output load being selectively actuated in response to control of the energy gating means 500.

Power provided by the first power supply portion 214 is directed to the light detection means 300, and to the control signal providing means 400. Exemplary embodiments of the light detection means 300 and the control signal providing means 400 are operable to gate the energy gating means 500 independently of input voltage variations and temperature fluctuations.

More particularly, the photodiode 302 of the light detection means 300 produces a current signal proportional to incident (e.g., ambient) light and is connected to a current-to-voltage converter generally labeled 304. The current-to-voltage converter 304 includes, in an exemplary embodiment, an operational amplifier 306 having a feedback resistor 308 and a resistor 310 connected to ground. In an exemplary embodiment, both the feedback resistor 308 and the resistor 310 can be 1.8 mega-ohm resistors.

The output of the operational amplifier 306 represents a voltage which is directly proportional to the amount of light incident upon the photodiode 302, and this voltage is applied to a level detector 402 of the control signal providing means 400. The control signal providing means 400 processes the output of the photodiode 302 to improve noise immunity of the FIG. 1 switching circuit such that the photodiode 302 and the energy gating means 500 can be housed in a single unit, explosion-proof enclosure.

Although the exemplary FIG. 1 circuit has been described with the use of a photodiode 302, those skilled in the art will recognize that other light sensitive devices can be used in the light detecting means 300. For example, the photodiode can be replaced with a phototransistor, the output of the phototransistor being applied directly to the level detector 402 thus eliminating the current-to-voltage converter 304. However, because phototransistors are typically sensitive to infrared light, a photodiode and current-to-voltage converter have been described with respect to the exemplary FIG. 1 embodiment. Such an embodiment provides a response which more closely resembles light detected by the human eye, rendering the switching circuit more suitable for use in controlling lighting fixtures in response to ambient light conditions. In an exemplary embodiment, approximately a 1.7 volt DC output will be produced by the current-to-voltage converter in response to an incident light intensity of eight foot-candles on the photodiode 302.

The level detector 402 of the control signal providing means 400 includes a first comparator 404. A resistor 406 is provided for draining bias currents at the negative input of the comparator 404. In an exemplary embodiment, the resistor 406 can be a 100 kilo-ohm resistor connected between the current-to-voltage converter output and ground. A threshold reference for causing a change in the output state of the comparator 404 is established by serially connected resistors 408 and 410. The resistor 408 in an exemplary embodiment is a 470 kilo-ohm resistor and the resistor 410 in an exemplary embodiment is a 100 kilo-ohm resistor. These resistors are serially connected between the output of the first power supply portion 214 and ground, with a mid-point connection between the resistors 408 and 410 being used to establish a threshold at the positive input of the comparator 404. A feedback resistor 412 of the comparator 404 provides hysteresis for the comparator 404, and a resistor 414 sources current to the comparator. In an exemplary embodiment, the resistor 412 can be a 56 kilo-ohm resistor and the resistor 414 can be a 10 kilo-ohm resistor.

In operation, the output of the comparator 404 is OFF when the light incident on the photodiode 302 is of sufficient magnitude that the negative input to the comparator 404 exceeds the positive threshold reference established by the resistors 408 and 410. On the contrary, the comparator 404 is ON when insufficient light intensity is incident at the photodiode 302, such that the positive input to the comparator 404 exceeds the negative input to the comparator 404. An output of the comparator 404 is directed to a timing circuit of the control signal providing means 400, the timing circuit being generally labeled 416.

The output from the comparator 404 is used to charge a capacitor 418 of the timing circuit 416 via a serially-connected resistance generally labeled 420 and including, in an exemplary embodiment, two serially connected 100 kilo-ohm resistors 422 and 424. The capacitor 418 and the serially-connected resistance 420 constitute an RC circuit. The charging of the capacitor 418 through the resistance 420 is used to provide a time delay for the timing circuit 416. During an OFF condition of the comparator 404 (i.e., when sufficient light is incident on the photodiode 302 such that the comparator 404 is turned OFF), the capacitor 418 discharges through ground. On the contrary, when the comparator 404 is in an ON condition (i.e., insufficient light is incident on the photodiode 302) the capacitor 418 is charged via power from the first power supply portion 214. In an exemplary embodiment, the capacitor 418 is a 16 volt, 47 microfarad capacitor.

The voltage across the capacitor 418 is input to the positive input of a second comparator 426 included in the timing circuit 416. A feedback resistor 432 is provided with the second comparator 426 to provide a small hysteresis and prevent chatter at the second comparator. In an exemplary embodiment, the comparator 426 is triggered to an ON condition when the voltage across the capacitor 418 exceeds approximately one-half of the voltage supply produced by the first power supply portion 214. This threshold for the comparator 426 is established by a voltage divider which includes, in an exemplary embodiment, two resistors 428 and 430. The resistors 428 and 430 are serially connected across the first power supply portion 214 and ground. A mid-point between the resistors 428 and 430 is used to establish the threshold value for the second 35 comparator, with this mid-point being input to the negative input of the comparator 426.

In an exemplary embodiment the resistors 428 and 430 are 100 kilo-ohm resistors which establish the voltage threshold at one-half of the voltage available from the first power supply portion 214. However, those skilled in the art will recognize that this threshold is used so that the delay used to control a transition of the control signal providing means 400 (i.e., output of comparator 426) from an ON condition to an OFF condition is equal to the delay used to control a transition from an OFF condition to an ON condition. In other embodiments, the resistances can be altered so that the delay in transitioning from an ON condition to an OFF condition is different than a transition from an OFF condition to an ON condition (i.e., provide a first threshold to produce the control signal and a second threshold, different from the first threshold, to discontinue the control signal). This operation, in conjunction with the operation of the first comparator 404, provides hysteresis for rendering the FIG. 1 circuit immune to undesirable oscillatory modes of operation wherein the circuit repeatedly transitions between on and off states.

The timing circuit provides a delay of, for example, 10 seconds during switching from an ON condition to an OFF condition and during switching from an OFF condition to an ON condition. The use of a delay prevents the FIG. 1 circuit from switching in response to short term changes in ambient conditions. For example, the delay prevents the circuit from switching the load to an OFF condition during sudden bursts of high intensity light due, for example, to the occurrence of lightening. Further, the delay prevents the load from switching to an ON condition during short term loss of high intensity light (e.g., due to plane overhead).

The comparator 426 functions as a current sink for a bi-directional switch of the energy gating means 500 used to control the power supply to the load. The energy gating means 500 includes, in an exemplary embodiment, the opto-coupler 502. In an exemplary embodiment, the opto-coupler 502 can be a modular device available from Siemens Electronics Corp., such as the device Model Number IL420. The opto-coupler includes a light emitting diode (LED) in series between the second power supply portion 222 and the output of the second comparator 426. Thus, when the second comparator 426 is in an OFF condition (i.e., incident light at photodiode 302 exceeds the threshold of the first comparator 404), the LED of the opto-coupler 502 is reverse biased such that the device is turned OFF. However, when the comparator 426 is in an ON condition (i.e., insufficient light incident of the photodiode 302), current passes through the LED of the opto-coupler to gate this device ON.

The opto-coupler device includes a bi-directional switch which is optically linked with the diode of the opto-coupler 502. The light detecting means 300 and the control signal providing means 400 in the exemplary embodiment of FIG. 1 operate to provide a digital (i.e., on or off) drive signal for the opto-coupler 502. When the output of the comparator 426 is in an ON condition such that current passes through the LED of the opto-coupler 502, the bi-directional switch of the opto-coupler permits current to be applied to a gate 504 of a high-power bi-directional switch 506, thus driving the bi-directional switch 506. Those skilled in the art will appreciate that where low power loads are driven, the opto-coupler can be used to drive the load directly (i.e., without the bi-directional switch 506).

In an exemplary embodiment, the high power bi-directional switch 506 is a bi-directional thyristor such as a TRIAC available from Motorola, Inc., or two silicon controlled rectifiers (i.e., SCRs). Although the exemplary FIG. 1 circuit uses a solid-state, bi-directional switch such as the aforementioned TRIAC, those skilled in the art will appreciate that an electro-mechanical switch (e.g., relay) can be used if the relay is sealed and/or enclosed in an explosion-proof housing. For example, a relay could be sealed in a conventional potting compound to comply with Class I, Division 2 requirements. Use of a sealed relay can provide advantages such as avoidance of heating problems which can inhibit proper operation of electronic switches, and an ability to set a fail condition in either an unenergized or energized position. Thus, in accordance with present invention, the FIG. 1 circuit (including the opto-coupler 502) can be used to drive the sealed relay in a manner similar to that which is used to drive the bi-directional switch 506 where that switch is a TRIAC.

Power leads of the bi-directional switch 506 are connected in series between the output line 230 and the common power supply line 204, such that when the gate of the bi-directional switch 506 is gated ON by the opto-coupler 502, energy can be directed from the power supply inlet through the bi-directional switch 506 to the load connected across the lines 202 and 230.

The energy gating means 500 also includes a current limiter represented as a resistor 508, which in an exemplary embodiment is a 180 ohm resistor. Further, the energy gating means 500 includes a snubber network which, in an exemplary embodiment, includes a capacitor 510 and a resistor 512. For example, the resistor 512 can be a 180 ohm resistor and the capacitor 510 can be a 0.033 microfarad, 630 volt capacitor. The capacitor 510 and resistor 512 are serially connected across the bi-directional switch 506, and limit the rate of current rise (i.e., di/dt) through the bi-directional switch to prevent false commutation and damage to the bi-directional switch 506.

Figure 3A:
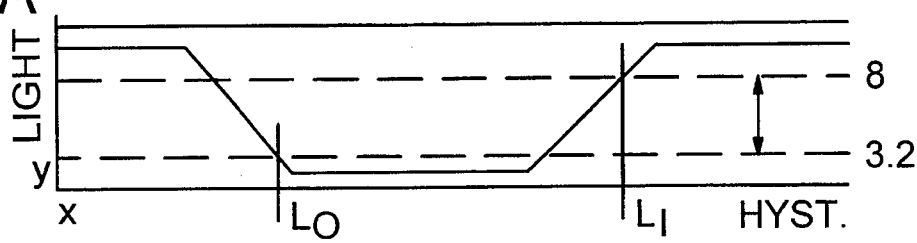
FIGS. 3A–3F illustrate waveforms associated with an exemplary operation of the FIG. 1 circuit diagram.
Figure 3B:
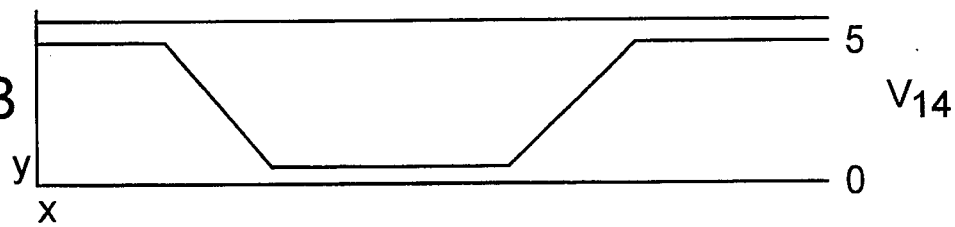
Figure 3C:
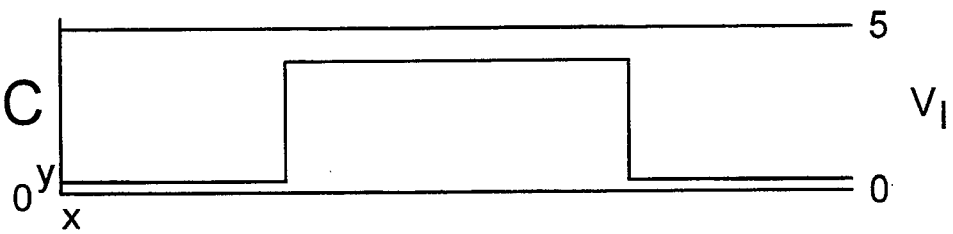
Figure 3D:
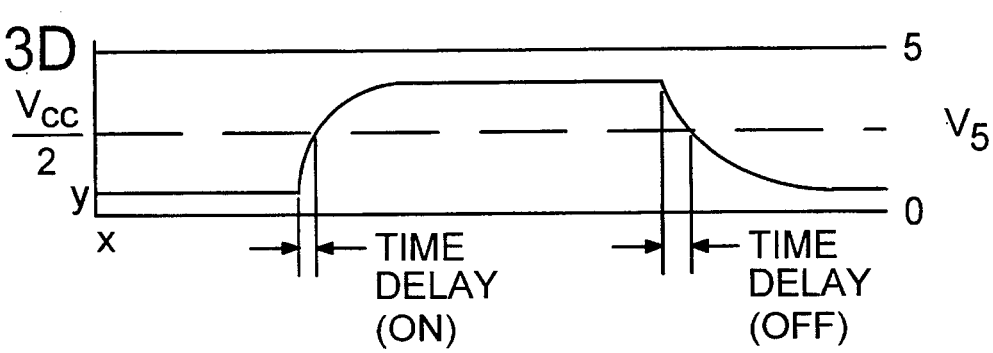
Figure 3E:
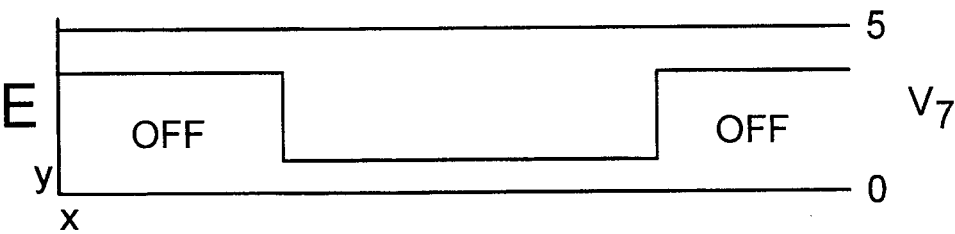
Figure 3F:
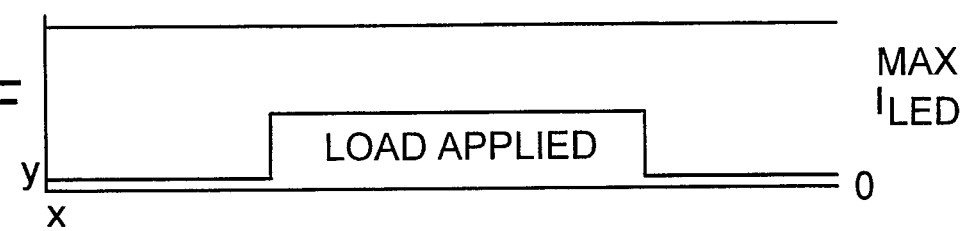

Operation of the FIG. 1 circuit will now be described with reference to FIG. 1 and the waveforms of FIGS. 3A–3F which correspond to various circuit nodes of the FIG. 1 circuit. FIG. 3A corresponds to the ambient light present at the input to the photodiode 302. FIG. 3F corresponds to the current which passes through the LED of the opto-coupler 502 for driving a load (e.g., the ballast of a lamp) connected across the output lines 202 and 230.

The various waveforms represented by FIGS. 3B, 3C, 3D and 3E correspond to voltages at nodes correspondingly labeled in FIG. 1. That is, FIG. 3B corresponds to the voltage at the output of the operational amplifier 306 of the current-to-voltage converter 304, FIG. 3C corresponds to the voltage at the output of the first comparator 404, FIG. 3D corresponds to the voltage present at the capacitor 418 and the input to the second comparator 426, and FIG. 3E corresponds to the voltage present at the output of the second comparator 426 which is used to drive the LED of the opto-coupler 502.

In operation, the second comparator 426 is in an ON condition when the voltage at the capacitor 418 exceeds the threshold established by the resistors 428 and 430. Thus, when light incident at the photodiode 302 is insufficient to maintain the first comparator 404 in an OFF condition, the capacitor 418 is charged. When the voltage at the capacitor 418 exceeds one-half of the voltage available from the first power supply portion 214, the second comparator 426 enters an ON condition after a time delay. The comparator 426 remains in an ON condition until light incident at the photodiode 302 becomes of sufficient intensity to turn the first comparator 404 OFF such that the capacitor 418 can discharge to a voltage less than the threshold established by the resistors 428 and 430.

Thus, when a light level below the bottom threshold level of the first comparator is incident upon the photodiode 302 (i.e., at a intensity below 3.2 foot candles), the comparator 404 is placed into an ON condition to charge the capacitor 418. After an appropriate time delay established by the time constant of capacitor 418 and the threshold of the comparator 426, the comparator 426 is placed into an ON condition to forward bias the opto-coupler 502. Thus, the load connected between the leads 202 and 230 is energized.

On the contrary, when a light intensity greater than an upper threshold level is incident upon the photodiode 302 (e.g., light intensities greater than 8.7 foot candles, such as 10 or 11 foot candles), the comparator 404 is placed into an OFF condition such that the capacitor 418 discharges. After an appropriate time delay established by the time constant of capacitor 418 and the threshold of the comparator 426, the comparator 426 is placed into an OFF condition thereby de-activating the opto-coupler 502 and stopping current flow into the gate of the bi-directional switch 506. Thus, when sufficient light is incident on the photodiode 302, AC current is prevented from flowing through the bi-directional switch 506 such that the load connected between leads 202 and 230 is turned OFF. The actual values used to place the comparator 404 into its ON and OFF conditions is not critical, and those skilled in the art can readily adapt these thresholds to any suitable application.

Those skilled in the art will appreciate that while a direct relationship between ambient light and the output of the photodiode has been described with respect to FIG. 1, an indirect relationship between the voltage produced by the converter 306 and the light intensity can also be used. In this case, those skilled in the art will appreciate that the logic associated with the charging and discharging of the capacitor 418 and the control of the gate for the bi-directional switch 506 must be modified accordingly. Alternately, insufficient light at the photodiode can be used to gate OFF the bi-directional switch 506 (e.g., if the photodiode is to gate a load on during periods of relatively high ambient light).

The exemplary embodiment as illustrated in FIG. 1 has been described with respect to analog components. The operational amplifiers used to form the exemplary elements 306, 404 and 426 are readily available as a single chip device and therefore relatively cost-effective. However, those skilled in the art will appreciate that alternate amplifiers and comparators can be used to implement the functions of the FIG. 1 devices. Further, digital circuitry can be used by converting the output from the light detecting means (e.g., the photodiode 302) into a digital value and then digitally processing this signal to control the bi-directional switch 506. Thus, those skilled in the art will readily appreciate that any current-to-voltage converters and comparators can be used in accordance with the present invention, analog or digital.

The operational amplifiers and comparators used in accordance with the present invention constitute general purpose components and can be readily obtained by those skilled in the art. For example, a Motorola Chip MC3505L is available which includes two operational amplifiers and two comparators, three of which can be used for the converter 306, the comparator 404 and the comparator 426 (one operational amplifier remaining unused). The use of the Motorola chip which includes two operational amplifiers and two comparators is selected solely for its cost-effectiveness in implementing the control circuit necessary for producing the non-mechanical switching of the exemplary FIG. 1 circuit.

Further, those skilled in the art will appreciate that numerous devices are appropriate for use as the bi-directional switch 506, and are readily available. Table I above illustrates three such devices available from Motorola, including the Motorola Device 2N6345A.

In accordance with the present invention, such as the exemplary embodiment described with respect to FIG. 1, significant advantages can be realized. For example, embodiments of the present invention avoid any need for electro-mechanical parts which can result in detrimental arcing or sparking. The elimination of moving parts also enhances switching reliability. By eliminating electro-mechanical parts, and by providing a photocell switching circuit which is immune to noise, the photocell switching circuit can be designed more cost-effectively in a single unit, explosion-proof enclosure. As referenced herein, the phrase "explosion-proof" represents an enclosure suitable for use with Class I, Division 1 and 2 environments as defined by the aforementioned 1993 National Electric Code.

Figure 2A:
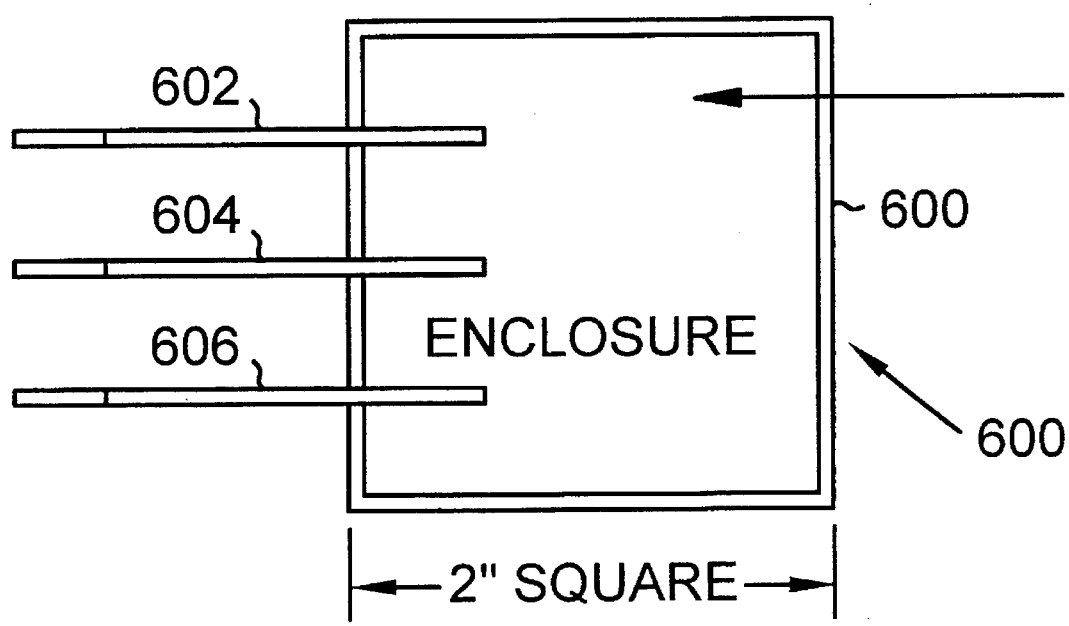
FIGS. 2A and 2B show a single unit enclosure means for potting the FIG. 1 photocell switching circuit.
Figure 2B:
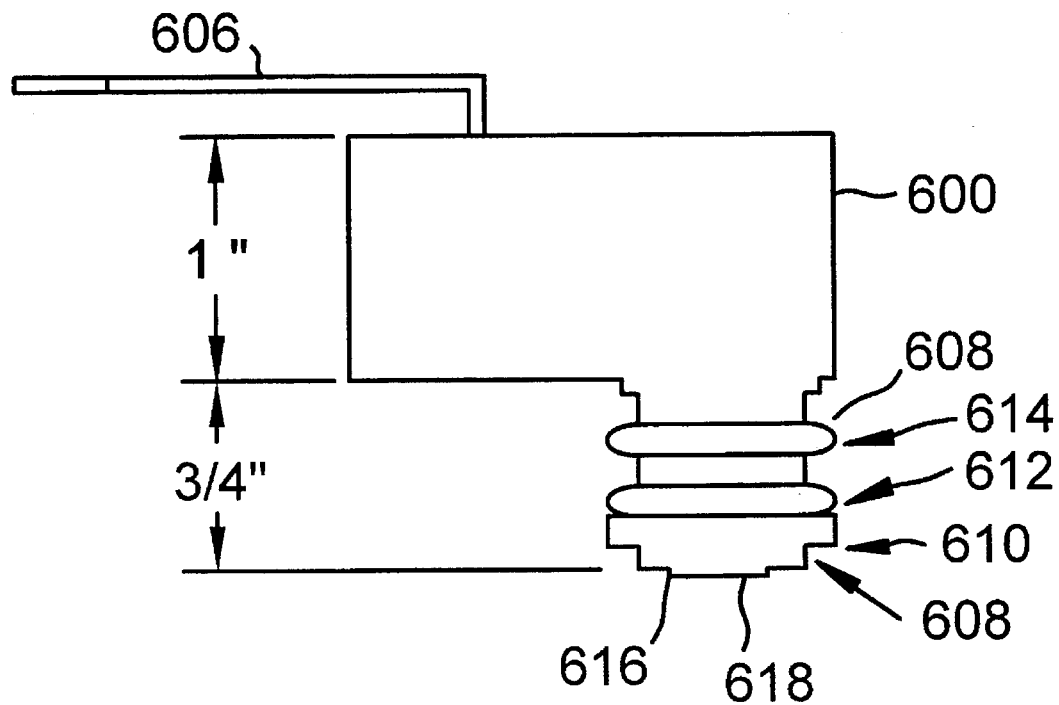

In accordance with a significant feature of the present invention, a photocell switching circuit such as the exemplary FIG. 1 circuit can be encapsulated in a single, relatively small enclosure means such as the enclosure means 600 of FIGS. 2A and 2B. As illustrated in the exemplary FIG. 2A embodiment, the enclosure means 600 can be a small case formed of a thermoplastic material. The thermoplastic material used to form the casing of the enclosure means 600 can, for example, be Dupont Rynite FR-530™. The small case includes four walls and a bottom connected to each of the four walls.

The FIG. 1 circuit can be formed on, for example, a printed circuit board and placed into the open top of the FIG. 2A enclosure means. Wire leads 602, 604 and 606 are connected to the printed circuit board which contains the exemplary FIG. 1 circuit, and protrude from the FIG. 2A enclosure means for connection to an exterior circuit. The three wire leads 602–606 correspond to the leads 202, 204 and 230 in the exemplary FIG. 1 circuit, and thus provide power input and power output to load connections.

After placing the printed circuit board which includes the FIG. 1 photocell switching circuit into the enclosure means 600 of FIG. 2A, a potting material such as a liquid epoxy compound can be inserted into the enclosure means from the open end. The potting material can, for example, be a 281 resin ™ compound available from 3M Company. Once placed into the enclosure means, the liquid epoxy material solidifies to retain the printed circuit board fixed within the enclosure means and to provide environmental protection against corrosion of the printed circuit board.

On a bottom side of the enclosure means 600 is a protrusion 608 used to house the photocell and to mount the photocell switching circuit to a fixture, such as a lighting fixture. An exterior of the protrusion 608 includes a series of threads for mounting the enclosure means 600 to the fixture. For example, a ⅜–18 straight thread can be molded into an exterior of the protrusion 608. A nylon knurled nut can be threaded onto the threads for contact with the fixture to which the enclosure means is to be mounted.

A bottom side 616 of the protrusion includes a small light transparent window such that the photodiode 302 (FIG. 1) which is housed within the protrusion will be in light communication with ambient light in an exterior vicinity of the enclosure means 600. For this purpose a transparent surface 618 is located in an end of the protrusion 600 so that the photodiode can detect ambient light. Alternately, the end of the protrusion can be left open during manufacture of the enclosure means 600, and then filled in with a transparent liquid epoxy once the photocell is in place. When the liquid epoxy solidifies, it seals the enclosure means while still permitting the photocell to detect ambient light.

Thus, exemplary embodiments of the present invention permit a photocell switching circuit to be housed into a single-unit enclosure means. Such a circuit is relatively inexpensive to produce and place into an environmentally safe enclosure for use in Class 1, Division 2 hazardous locations with high temperature operating conditions. Because of the simplicity with which the photocell switching circuit can be housed into a single unit enclosure means, overall complexity is reduced, thus further reducing production costs. The elimination of electro-mechanical relays avoids susceptibility to arcing or sparking, and permits a much simpler technique to be used for housing the circuit in an environmentally safe enclosure means (e.g., using a thermoplastic casing and epoxy as described above). Such epoxy packaging techniques cannot be used in conjunction with electro-mechanical relays which require moving parts (i.e., the liquid epoxy would solidify about the electro-mechanical relay and inhibit movement of the contacts).

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A switching circuit comprising:

means for detecting light to produce a light detection signal;

means for producing a control signal in response to said light detection signal, wherein said control signal producing means includes hysteresis for generating said control signal by using a first threshold to produce said control signal and a second threshold to discontinue said control signal;

means responsive to said control signal for gating energy from a power supply providing means to a load;

means for supplying power to components of said switching circuit, said power supplying means including a first power supply portion for supplying drive power to said energy gating means and a second power supply portion for supplying power to said control signal producing means; and means for enclosing said energy gating means and said light detection means in a single unit enclosure.

2. A switching circuit according to claim 1, wherein said power supply means further includes:

input leads for receiving voltage from a power supply; and a varistor and a current limiter for clamping line spikes and for providing transient voltage protection.

3. A switching circuit according to claim 2, wherein each of said first and second power supply portions include a Zener diode, a filtering capacitor, and a static current limiter.

4. A switching circuit according to claim 1, wherein said light detection means further includes:

means for generating a current proportional to incident light.

5. A switching circuit according to claim 4, wherein said current generating means is a photodiode, said light detection means further including:

a current-to-voltage converter.

6. A switching circuit according to claim 1, wherein said control signal producing means further includes:

a first comparator for receiving an output from said light detection means; and means for generating a time delay in response to an output form said first comparator.

7. A switching circuit according to claim 6, wherein said time delay generating means further includes:

an RC circuit; and a second comparator for producing said control signal in response to a voltage output of said first comparator.

8. A switching circuit according to claim 7, wherein said energy gating means further includes:

an opto-coupler controlled in response to said control signal of said control signal providing means; and a power switch having a gate, said gate being controlled by an output of said opto-coupler to gate current to a load to be driven by said switching circuit.

9. A switching circuit according to claim 8, wherein said second comparator is selectively operated as a current sink for a light emitting diode of said opto-coupler.

10. A switching circuit according to claim 1, wherein said energy gating means further includes:

an opto-coupler controlled in response to said control signal of said control signal providing means; and a power switch having a gate, said gate being controlled by an output of said opto-coupler to gate current to a load to be driven by said switching circuit.

11. A switching circuit according to claim 10, wherein said energy gating means further includes:

a snubber network for limiting current transients through the power switch to prevent false commutation and damage to the power switch.

12. A switching circuit according to claim 1, wherein said enclosing means further includes:

(a) a thermoplastic casing for housing a printed circuit board upon which said switching circuit is mounted; and (b) epoxy for retaining and sealing said printed circuit board within said casing.

13. A switching circuit according to claim 1, wherein said control signal producing means operates independently of temperature variations of plus or minus 60° C.

14. A switching circuit according to claim 1, wherein said control signal producing means operates independently of control voltage variations of plus or minus 25 percent.

15. A switching circuit according to claim 1, wherein said control signal producing means supplies said control signal when incident light on said light detecting means is below 3.2 foot candles and discontinues said control signal when said incident light is above 8.7 foot candles.

16. A switching circuit according to claim 1, wherein said light detecting means further includes:

a photodiode for sensing incident light detectable by the human eye; and a current-to-voltage converter for producing said light detection signal as a signal proportional to light detectable by a human eye.

17. A switching circuit according to claim 16, wherein said light detecting means produces a DC output of approximately 1.7 volts in response to an incident light intensity of 8 foot-candles.

18. A switching circuit according to claim 17, wherein said control signal producing means operates independently of temperature variations over a predetermined temperature range.

19. A switching circuit according to claim 16, wherein said control signal producing means further includes:

means for generating a time delay in response to an output from said light detection means, said time-delay generating means including a circuit for integrating a signal produced in response to said output from said light detection means.

20. A switching circuit according to claim 19, wherein said current-to-voltage converter further includes:

an operational amplifier having two inputs, one of said two inputs receiving feedback from an output of said operational amplifier, said photodiode being connected between said two inputs of said operational amplifier to produce an output voltage proportional to current through said photodiode which in turn is proportional to said incident light.

21. A switching circuit according to claim 20, wherein said control signal producing means further includes:

a first comparator for producing a first output signal when light intensity incident on said photodiode is below a predetermined threshold, said first output signal being integrated by said time delay generating means, said time delay generating means further including:

a second comparator for producing said control signal whenever said time delay generating means receives said first output signal for a predetermined period of time.

22. A switching circuit according to claim 21, wherein said predetermined time is established by comparing said integrated first output signal to a first threshold of said second comparator, operation of said first comparator providing a first hystersis and said second comparator providing a second hysteresis different from said first hystersis.

23. A switching circuit according to claim 22, wherein said second comparator further includes:

a second threshold, different from said first threshold of said second comparator, for comparison with said integrated first output signal to discontinue producing said control signal.

24. A single unit photocell switching circuit comprising:

a switching circuit, said switching circuit further including:
(a) means for detecting light to produce a light detection signal;
(b) means for producing a control signal in response to said light detection signal, wherein said control signal producing means includes hysteresis for generating said control signal by using a first threshold to produce said control signal and a second threshold to discontinue said control signal;
(c) means responsive to said control signal for gating energy from a power supply to a load which is to be driven by the switching circuit;
(d) means for supplying power to components of said switching circuit, said power supplying means including a first power supply portion for supplying drive power to said energy gating means and a second power supply portion for supplying power to said control signal producing means; and means for enclosing said switching circuit, said enclosure means further including:
(i) a thermoplastic casing for housing said switching circuit; and
(ii) epoxy for retaining and sealing said switching circuit within said casing.

25. A switching circuit according to claim 24, wherein said light detecting means further includes:

a photodiode for sensing incident light detectable by the human eye; and a current-to-voltage converter for producing said light detection signal as a signal proportional to light detectable by a human eye.

26. A switching circuit comprising:

means for detecting light to produce a light detection signal;

means for producing a control signal in response to said light detection signal, wherein said control signal producing means includes hysteresis for generating said control signal by using a first threshold to produce said control signal and a second threshold to discontinue said control signal;

means for supplying power to components of said switching circuit, said power supplying means including a first power supply portion for supplying drive power to said energy gating means and a second power supply portion for supplying power to said control signal producing means; and means responsive to said control signal for gating energy from a power supply providing means to a load, said control signal producing means further including:

a first comparator for receiving an output from said light detection means; and means for generating a time delay in response to an output from said first comparator.

27. A switching circuit according to claim 26, wherein said time delay generating means further includes:

an RC circuit; and a second comparator for producing said control signal in response to a voltage output of said first comparator.

28. A switching circuit according to claim 26, wherein said light detecting means further includes:

a photodiode for sensing incident light detectable by the human eye; and a current-to-voltage converter for producing said light detection signal as a signal proportional to light detectable by a human eye.

* * * * *